United States Patent
Kinsey et al.

(10) Patent No.: US 9,029,685 B2
(45) Date of Patent: May 12, 2015

(54) MONOLITHIC BYPASS DIODE AND PHOTOVOLTAIC CELL WITH BYPASS DIODE FORMED IN BACK OF SUBSTRATE

(75) Inventors: Geoffrey S. Kinsey, Pasadena, CA (US); Richard R. King, Thousand Oaks, CA (US); Dmitri D. Krut, Encino, CA (US); Nasser H. Karam, La Canada, CA (US)

(73) Assignee: The Boeing Company, Chicago, IL (US)

( * ) Notice: Subject to any disclaimer, the term of this patent is extended or adjusted under 35 U.S.C. 154(b) by 1075 days.

(21) Appl. No.: 11/283,268

(22) Filed: Nov. 18, 2005

(65) Prior Publication Data

US 2007/0113884 A1 May 24, 2007

(51) Int. Cl.
*H01L 31/00* (2006.01)
*H01L 27/142* (2014.01)
*H01L 31/0725* (2012.01)

(52) U.S. Cl.
CPC .......... *H01L 27/142* (2013.01); *H01L 31/0725* (2013.01); *Y02E 10/50* (2013.01)

(58) Field of Classification Search
USPC ........................................................ 136/243
See application file for complete search history.

(56) References Cited

U.S. PATENT DOCUMENTS

| | | | |
|---|---|---|---|
| 5,616,185 A * | 4/1997 | Kukulka | 136/244 |
| 5,754,384 A * | 5/1998 | Ashley | 361/93.9 |
| 5,990,415 A | 11/1999 | Green et al. | |
| 6,278,054 B1 * | 8/2001 | Ho et al. | 136/256 |
| 6,316,716 B1 | 11/2001 | Hilgrath | |
| 6,359,210 B2 | 3/2002 | Ho et al. | |
| 6,452,086 B1 * | 9/2002 | Muller | 136/244 |
| 6,635,507 B1 * | 10/2003 | Boutros et al. | 438/57 |
| 6,864,414 B2 * | 3/2005 | Sharps et al. | 136/255 |
| 2005/0133083 A1 * | 6/2005 | Matsushita et al. | 136/251 |

FOREIGN PATENT DOCUMENTS

EP       0327023       5/1995

* cited by examiner

*Primary Examiner* — Matthew Martin
(74) *Attorney, Agent, or Firm* — Gates & Cooper LLP

(57) ABSTRACT

An apparatus and method for making a solar cell assembly. An apparatus in accordance with the present invention comprises a substrate, at least a first solar cell, coupled to a first side of the substrate, the first side of the substrate to be exposed to light such that the at least first solar cell generates a current when exposed to the light, and a bypass diode, formed on a second side of the substrate, the second side of the substrate being substantially opposite the first side of the substrate, such that the bypass diode is monolithically integrated with the at least first solar cell.

15 Claims, 8 Drawing Sheets

MONOLITHIC BYPASS DIODE AND PHOTOVOLTAIC CELL WITH BYPASS DIODE FORMED IN BACK OF SUBSTRATE

BACKGROUND OF THE INVENTION

1. Field of the Invention

The present invention relates to devices and methods for making semiconductor devices, and in particular to a device and method for making monolithic bypass-diodes and solar cell string assemblies.

2. Description of the Related Art

Solar cells are used in various technologies to provide power to other electronic assemblies. Satellites, calculators, and power systems are all examples of solar cell usage.

A solar cell is a p-n junction created over a large area on a semiconductor substrate. The junction creates a voltage and current when light of certain wavelengths strike the surface of the solar cell, and, as such, solar cells are photovoltaic devices. These photovoltaic cells provide a lightweight, maintenance-free power source for various applications, and also provide a pollution-free, distributed energy generation source for use in power delivery systems.

Solar cells are typically long-life devices, but can have their efficiency reduced or destroyed by reverse biasing of the solar cell junction. To prevent this type of damage, bypass diodes (BDs) are used to allow current to flow in an anti-parallel direction to the current flow through the solar cell junction.

Bypass diodes are typically formed using an isolated island structure on the front surface of the solar cell, or are discrete parts that are not integrated with the solar cell. As such, these island structures or discrete devices are typically connected to the solar cell using additional wiring and/or additional metallization on the solar cell substrate. The use of additional wiring and/or additional metallization creates new failure points for solar cells, as well as adding to the weight and complexity of the solar cell structure. Additional weight and failure mechanisms are unacceptable in a spacecraft environment, because of the extreme additional costs involved. Further, additional metallization obscures the solar cell from receiving incident light, which reduces the efficiency of the solar cell structure.

Further, by placing the bypass diode on the front surface of the solar cell, the solar cell area is reduced, and, as such, the solar cell cannot generate as much power. Since the area of a solar cell is a primary design consideration in many applications, additional solar cells would be needed to generate the desired power, which would increase the area and weight of the cells used for a given application, which may prove unacceptable from a design standpoint.

It can be seen that there is a need in the art for a solar cell that has an integrated bypass diode. It can also be seen that there is a need in the art for a solar cell that has a bypass diode that allows for maximum solar cell area. It can also be seen that there is a need in the art for a bypass diode that minimizes the weight and failure points for solar cell devices.

SUMMARY OF THE INVENTION

To address the requirements described above, the present invention discloses a method and apparatus for providing a bypass diode that is resident on the bottom of the substrate of the solar cell. The Monolithic Bypass Diode (MBD) of the present invention is formed in or on the growth substrate as opposed to inside of the epitaxial layers of the solar cell.

An apparatus in accordance with the present invention comprises a substrate, at least a first solar cell, coupled to a first side of the substrate, the first side of the substrate to be exposed to light such that the at least first solar cell generates a current when exposed to the light, and a bypass diode, formed on a second side of the substrate, the second side of the substrate being substantially opposite the first side of the substrate, such that the bypass diode is monolithically integrated with the at least first solar cell.

Such an apparatus optionally includes the bypass diode being formed in the substrate, using a schottky barrier, or being grown on the substrate, the solar cell being a multi-junction solar cell, the bypass diode is connected to a solar cell resident on a solar cell assembly other than the solar cell assembly where the bypass diode is formed, the substrate being etched away prior to forming the bypass diode, the bypass diode being electrically isolated from the substrate, and the bypass diode being connected in an anti-parallel fashion with the at least one solar cell.

A method in accordance with the present invention comprises forming at least one solar cell on a first side of a substrate, the first side of the substrate to be exposed to light such that the at least first solar cell generates a current when exposed to the light, forming a bypass diode on a second side of the substrate, the second side of the substrate being substantially opposite the first side of the substrate, and coupling the bypass diode to the at least one solar cell.

Such a method optionally further includes the bypass diode of a first assembly being coupled to a solar cell on a second assembly, the bypass diode being formed in the substrate, grown on the substrate, or being formed using a schottky barrier, the solar cell being a multi-junction solar cell, etching the substrate away prior to forming the bypass diode, and the bypass diode being electrically isolated from the substrate.

The present invention provides a solar cell that has an integrated bypass diode. The present invention also provides a solar cell that has a bypass diode that minimizes the need for additional wiring and/or metallization interconnects, as well as minimizing the weight and failure points for solar cell devices and maximizes solar cell area.

BRIEF DESCRIPTION OF THE DRAWINGS

Referring now to the drawings in which like reference numbers represent corresponding parts throughout.

DETAILED DESCRIPTION OF THE PREFERRED EMBODIMENT

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

The present invention monolithically incorporates a bypass diode into a solar cell assembly. The present invention creates the bypass diode without complex processing steps, which increases the yield for the finished device.

Prior art processes, such as those described in U.S. Pat. No. 5,616,185, entitled "SOLAR CELL WITH INTEGRATED BYPASS DIODE AND METHOD," describe using a discrete bypass diode that is integrated with the solar cell as a hybrid assembly. The bypass diode is integrated with the solar cell by forming recesses on the non-illuminated side of the solar cell and placing at least one discrete low-profile bypass diode in the recesses so that each bypass diode is approximately flush with the back side of the solar cell. Each bypass diode is then bonded to the solar cell for anti-parallel connection across the solar cell.

The back side of the solar cell is preferably formed with a honeycomb pattern of recesses to reduce the weight of the solar cell while maintaining mechanical strength. The recesses that receive bypass diodes preferably have a rectangular shape that better accommodates the bypass diode.

This prior art technique makes the solar cell difficult to make, because the rear of the solar cell must be patterned and etched to receive the bypass diodes, and the bypass diodes must then be electrically connected to the solar cells. These additional process steps are costly and provide additional failure mechanisms for the completed assembly.

Figure 1A:
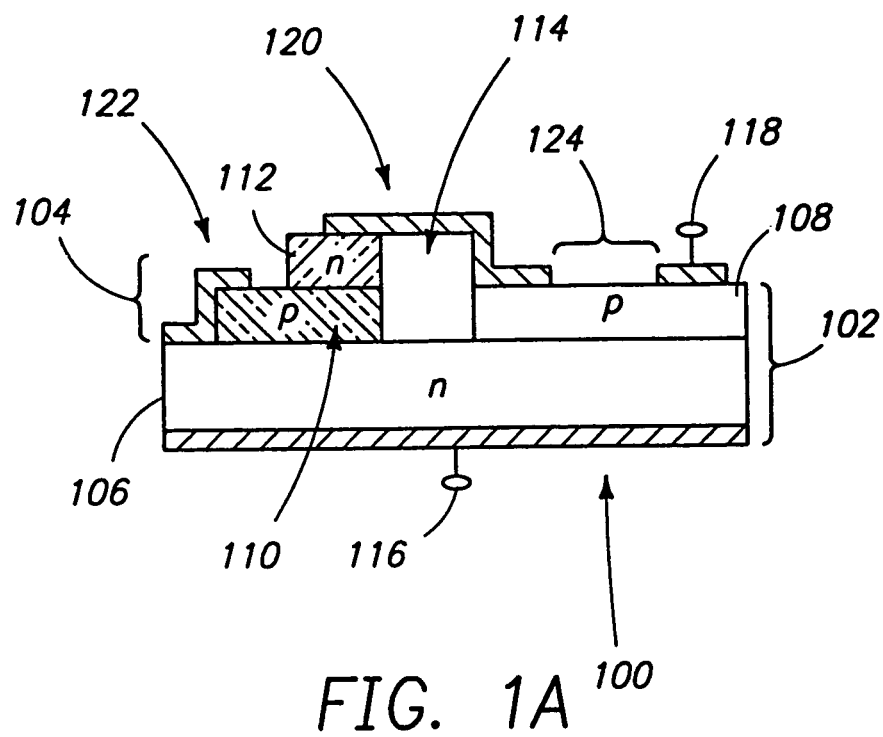
FIGS. 1A-1B illustrate a prior art device that integrates bypass diodes with solar cells.
Figure 1B:
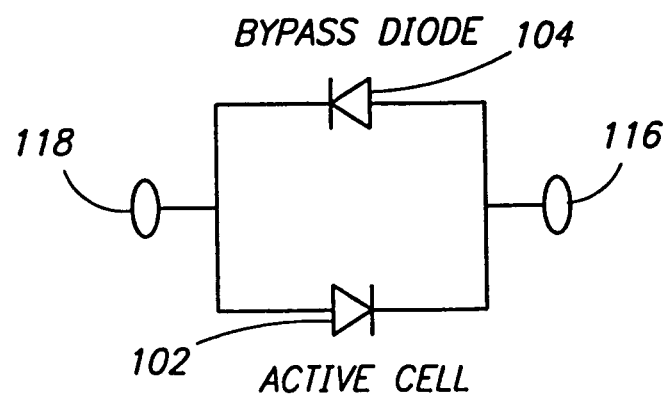

FIGS. 1A-1B illustrate a prior art device that integrates bypass diodes with solar cells.

FIG. 1A illustrates a cross-sectional view of a semiconductor device. Assembly 100 comprises solar cell 102 and bypass diode 104. Solar cell 102 utilizes an n-doped substrate 106 and a coupled p-doped layer 108. Substrate 106 and layer 108 are coupled electrically, such that a depletion layer is created between substrate 106 and layer 108. The method of coupling can be, for example, deposition of layer 108 on substrate 106, diffusion of p-type carriers into substrate 106 to form layer 108, chemical vapor deposition of layer 108, epitaxial growth of layer 108 on substrate 106, or other methods.

Bypass diode 104 utilizes a p-doped layer 110 and an n-doped layer 112 to create a separate p-n junction. Layer 110 is electrically coupled to substrate 106, and is isolated from layer 108 by a dielectric isolation layer 114. External connections 116 and 118 are complemented by metallization connections 120 and 122 to create the solar cell/bypass diode assembly 100.

FIG. 1B illustrates a schematic diagram for assembly 100. Bypass diode 104 and solar cell 102 are connected in an anti-parallel configuration, with external connections 116 and 118 shown, in order to connect the assembly 100 to other assemblies 100.

The limitations of the assembly 100 shown in FIG. 1A is that there is a third p-n junction in the assembly, namely, that created by the coupling of layer 110 and substrate 106. Further, the active area of the solar cell 102, shown as area 124, is reduced by the physical size of isolation layer 114 and the presence of bypass diode 104. Since the active area 124 of the solar cell is smaller than without bypass diode 104, a larger number of solar cells 102 will be required to produce a given amount of power. The assembly also uses a large metallization area, namely 120 and 122, which makes processing the assembly 100 more difficult, and reduces the yield because of the failures of the interconnections 120 and 122.

Figure 2:
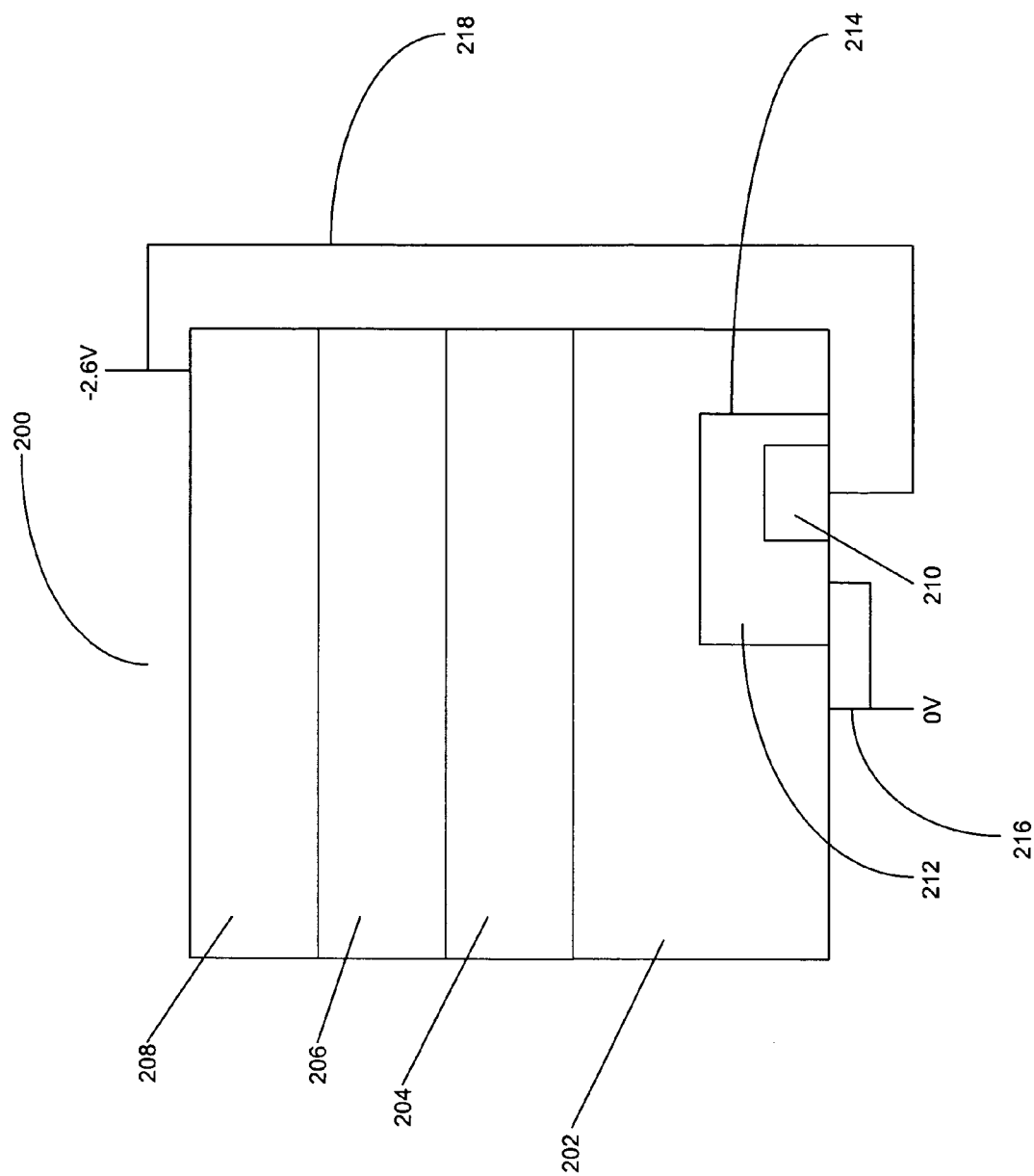
FIG. 2 illustrates a device in accordance with the present invention that integrates bypass diodes with solar cells.

FIG. 2 illustrates a device in accordance with the present invention that integrates bypass diodes with solar cells.

Assembly 200 comprises substrate 202, first cell 204, second cell 206, and third cell 208, along with well 210 and well 212 which are resident inside of substrate 202. Substrate 202 is typically a p-doped germanium substrate, but can comprise other materials such as silicon, indium phosphide (InP), gallium arsenide (GaAs), gallium indium phosphide (GaAsP), or other materials, or be doped with other materials to make any of the materials n-doped materials, without departing from the scope of the present invention.

First cell 204, second cell 206, and third cell 208 each comprise a p-doped region and an n-doped region, and, as such, each cell 204-208 comprises a p-n junction, and, thus, each cell 204-208 is a solar cell. First cell 204 is typically a germanium solar cell, second cell 206 is typically a gallium indium arsenide (GaInAs) solar cell, and third cell 208 is typically a gallium indium phosphide (GaInP) solar cell, but first cell 204, second cell 206, and third cell 208 can be made of other materials if desired. The cells 204-208 respond to different frequencies of incident light to increase the efficiency of assembly 200. As light is incident on assembly 200, namely, on the top of third cell 208 that is resident on one side of substrate 202, the assembly 200 generates current through the photovoltaic process.

Wells 210 and 212 comprise the bypass diode of assembly 200, and are located on a second side of the substrate 202, which is substantially opposite to the side where cells 204-208 are located. Typically well 212 is an n-doped germanium well, and well 210 is a p-doped germanium well, which are usually formed using diffusion and drive techniques or ion implantation techniques. However, it is envisioned that wells 210 and 212 can also be formed during the steps used to create first cell 204, or steps that are used to form any of the cells 204-208. As such, the formation of wells 210 and 212 do not add to the complexity of making assembly 200, nor does the formation of wells 210 and 212 reduce the yield of assembly 200, because the steps used to form wells 210 and 212 are done prior to or in conjunction with the formation of the discrete solar cells 204-208. For example, and not by way of limitation, diffusion from epitaxial layers grown on the back of substrate 200, e.g., an arsenide or phosphorous diffusion from a III-V semiconductor growth used to form first cell 204 cam form wells 210 and 212 simultaneously if desired.

Depending on the material used for substrate 202, the wells 210 and 212 may need to be doped differently than the p-n junctions that are formed in one of the cells 204-208. For example, if substrate 202 is a germanium substrate, the dopant levels for wells 210 and 212 need to be kept low enough such that the diode formed by wells 210 and 212 does not suffer reverse breakdown while still maintaining a low leakage current when the diode formed by wells 210 and 212 (also referred to herein as a Monolithic Bypass Diode, or MBD 214) is in reverse bias. This reverse bias condition occurs when the first cell 204, second cell 206, and/or third cell 208 are in a forward bias condition, which is when the assembly 200 is in an operational state. As such, in a normal solar cell operation mode, the MBD 214 blocks current as reverse biases with a magnitude of the open-circuit voltage of the cells 204-208 that it protects, and possibly at voltages slightly higher than the open-circuit voltage of the cells 204-208.

Connections 216 and 218 are also shown, to show a typical connection between MBD 214, substrate 202, and third cell 208. If assembly 200 is a single-junction solar cell, then second cell 206 and third cell 208 are not present, and connection 218 would connect to the top of first cell 204, and if it is a dual-junction cell, connection 218 would connect to the top of second cell 206. Such a connection is again an anti-parallel connection of the MBD 214 and cells 204-208.

Figure 3:
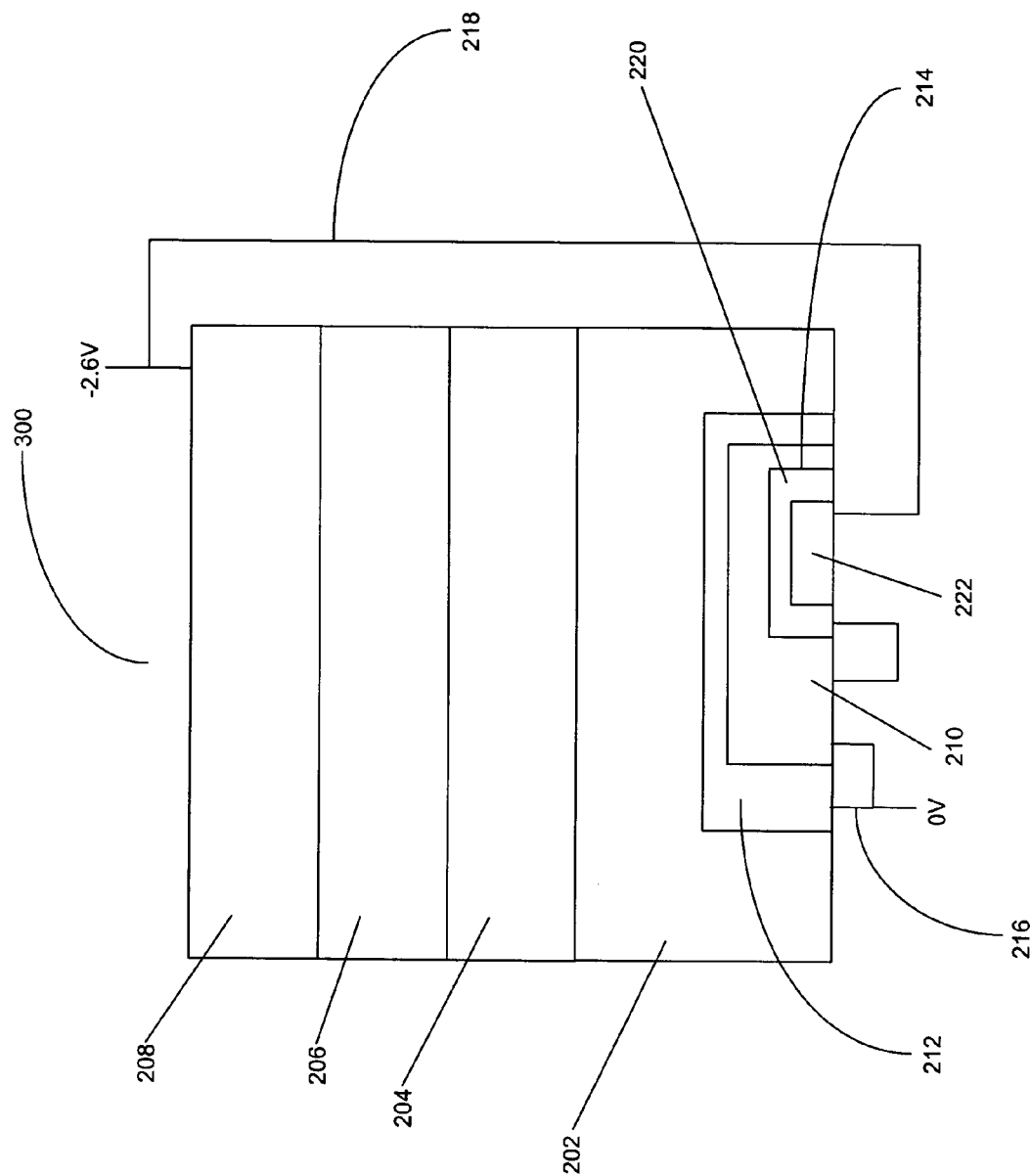
FIG. 3 illustrates an alternative embodiment of the present invention.

FIG. 3 illustrates an alternative embodiment of the present invention.

When the leakage current of MBD 214 is too high at the voltage of the solar cell under normal operation (i.e., when light of the proper wavelength is incident on assembly 200), as may be the case for low bandgap substrate 202 materials such as germanium, the reverse bias across MBD 212 may result in a large leakage current, which would reduce the efficiency of assembly 200. Such a condition is undesirable.

Assembly 300 has additional wells 220 and 222, that form two diodes in series that comprise MBD 214. This lowers the reverse bias between well 222 and well 212 because of the additional p-n junction present in MBD 214 shown in FIG. 3. For example, and not by way of limitation, in a germanium system, with substrate 202 at a zero volt condition, well 212 is connected to substrate 202 via connection 216, which means well 212 is also at 0V. The reverse bias voltage between well 222, which is at −2.6V, and well 210 is only −1.3V, which essentially cuts any leakage current in half. Assembly 300 can be manufactured using ion implantation or deep diffusion techniques, as well as other techniques, which can be achieved economically in large batches of substrate 202 wafers.

Figure 4:
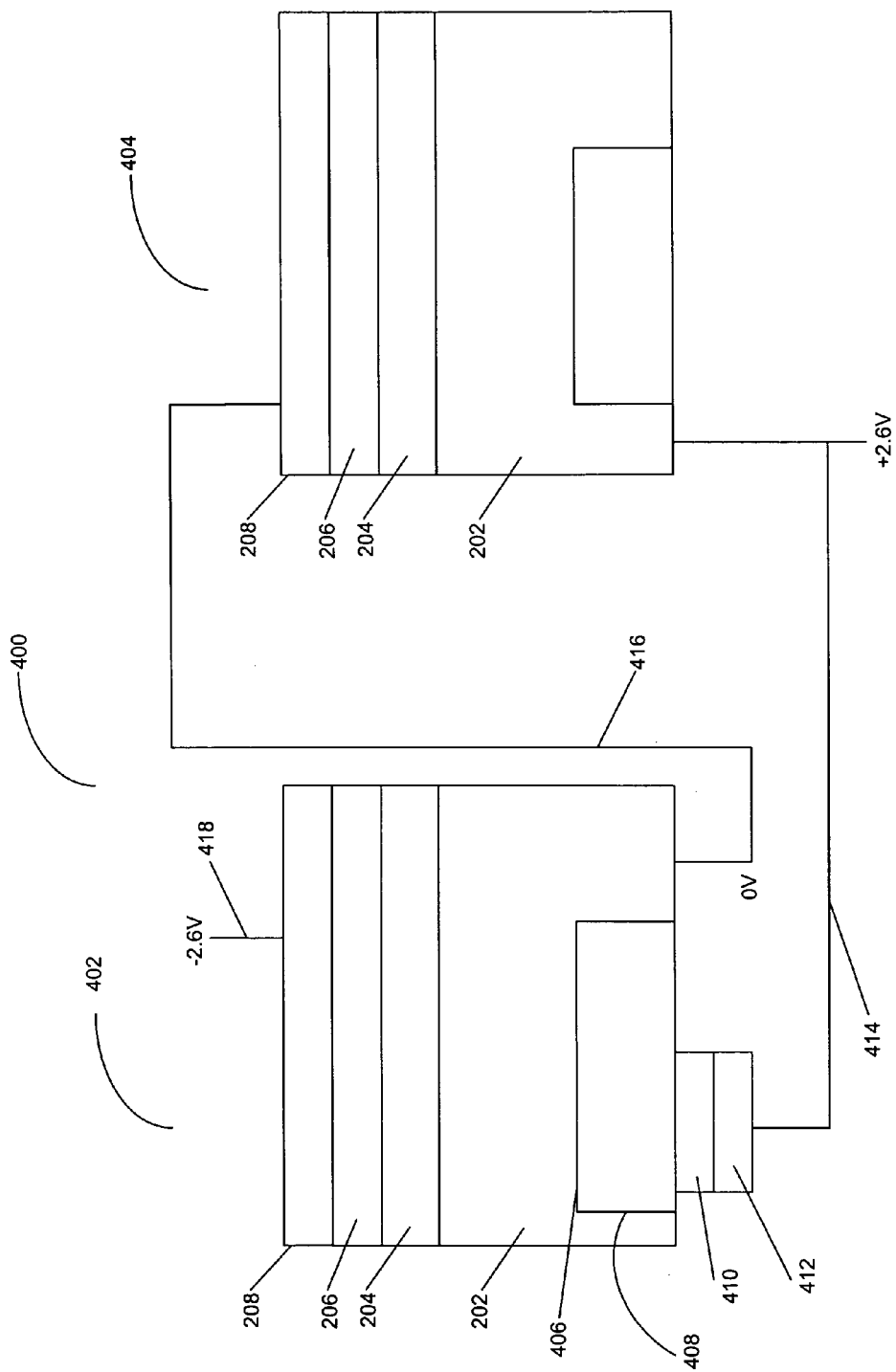
FIG. 4 illustrates a method of connection for the bypass diodes of the present invention.

FIG. 4 illustrates a method of connection for the bypass diodes of the present invention.

Assembly 400 comprises cell 402 and cell 404, which are separate solar cells that are connected in series. However, MBD 406, which is formed by well 408 and substrate 202, is formed when cell 402 is manufactured, but protects cell 404 in assembly 400. For example, and not by way of limitation, such an MBD 406 can be formed in a germanium substrate 202 when first cell 204 is being formed, which is typically done using epitaxial growth of III-V semiconductors, which also causes some diffusion on the back side of substrate 202, where well 408 is formed. The diffusion that initially forms well 408 is typically driven in using a separate drive step, or can be driven in during other epitaxial growth or annealing steps that approximate the drive step for well 408. Layer 410 in such an example is typically an n-doped GaInAs buffer layer, which is formed during a Metal-Organic Vapor-Phase Epitaxy (MOVPE) step used to form second cell 206. Finally, layer 412 in such an example is typically a n+ doped GaAs tunnel layer, which can be grown during MOVPE steps used to form second cell 206 as well.

Typically, back side growth on substrate 202 is undesirable. However, such diffusion and growth should be encouraged and controlled using standard masking and processing techniques to improve the reproducibility of forming the MBD 406.

Connections 414-418 are shown to illustrate how MBD 406 can be connected to protect cell 404. However, it is within the scope of the present invention to use MBD 406 to protect cell 402 if desired.

Thinned Substrate with MBD

Figure 5:
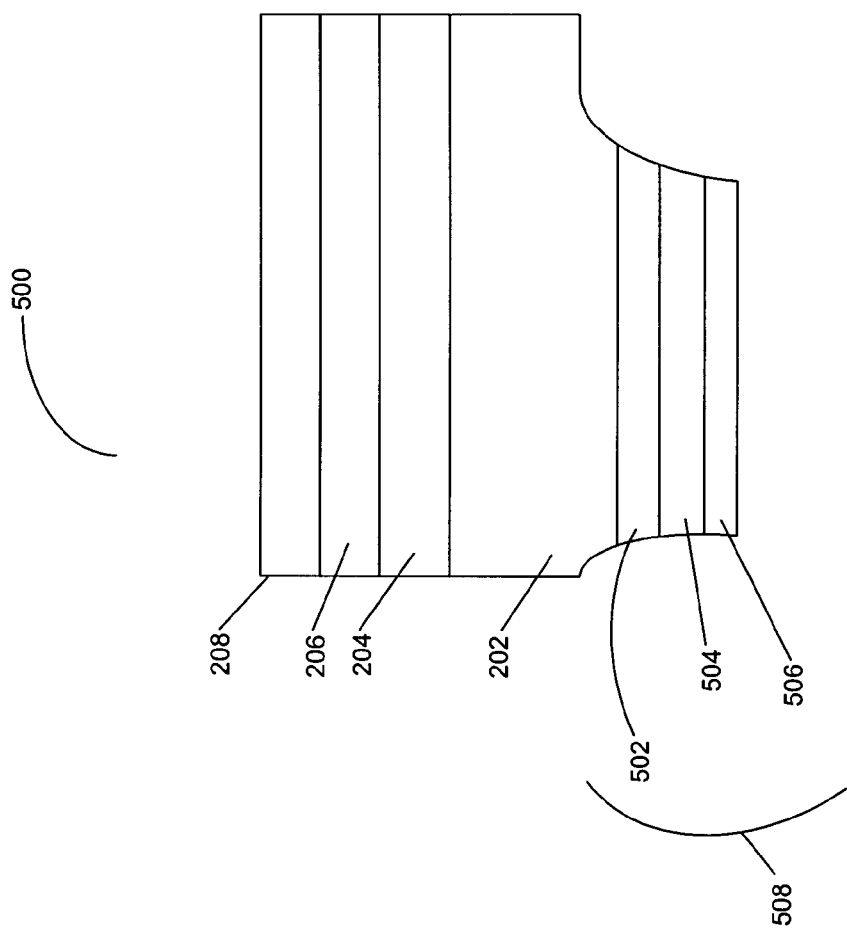
FIG. 5 illustrates a thinned substrate with an integrated MBD in accordance with the present invention.

FIG. 5 illustrates a thinned substrate with an integrated MBD in accordance with the present invention.

Assembly 500 illustrates a triple-junction solar cell as shown in FIGS. 2-4; however, assembly 500 has a thinned substrate 202. The doping layers 502, 504, and 506, in conjunction with substrate 202, form a MBD 508 similar to MBD 214 shown in FIG. 3. The planar doping layers 502 may be formed by a deep diffusion, followed by successively shallower dopant layers for doping layers 504 and 506. Further, the thinning or etching of substrate 202, which is typically a mesa etch over the back surface of substrate 202, leaves MBD 508 in a relatively small area and automatically defines the MBD 508. Such an approach reduces or eliminates the need for successive masks on the back side of substrate 202, since the diode structure for MBD 508 can be defined using a single etch mask step rather than multiple maskings for each successive well 210, 212, 220, and 222 shown in FIG. 3.

Schottky Diode Approach

Figure 6:
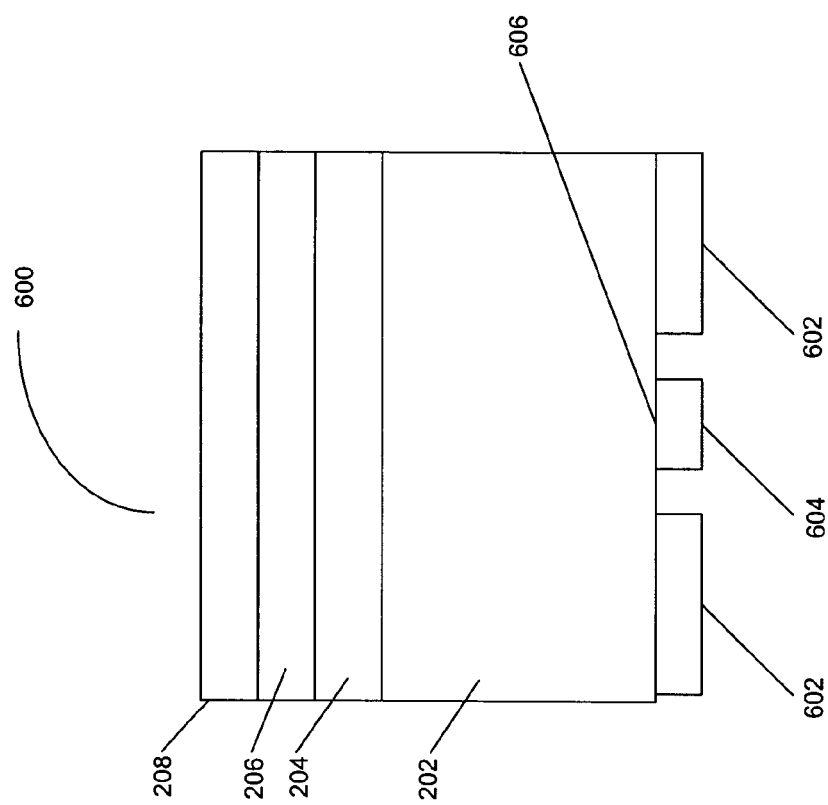
FIG. 6 illustrates a Schottky bypass diode in accordance with the present invention.

FIG. 6 illustrates a Schottky bypass diode in accordance with the present invention.

Assembly 600 is shown, with ohmic contacts 602 and schottky contact 604. Ohmic contacts 602 and schottky contact 604 are metallic depositions on the back of substrate 202, typically deposited using sputtering techniques, although other techniques can be used. A metal-semiconductor junction results in an Ohmic contact, i.e. a contact with voltage independent resistance if the Schottky barrier height, $\phi_B$, is zero or negative, and the junction will result in a Schottky contact 604 if the Schottky barrier height is positive. In the case of ohmic contacts 602, the charge carriers are free to flow in or out of the semiconductor with a minimal resistance across the contact.

However, for schottky contact 604, there is a directional resistance, which is similar to the resistance for a diode structure as described with respect to FIGS. 2-5. As such, a schottky MBD 606 can be formed by substrate 202 and schottky contact 604, which will operate the same as if there were a drive/diffusion of opposite type carriers and forming a p-n junction. Typically, such a schottky MBD 606 is formed when substrate 202 is doped p-type, and the schottky barrier is a metal, which has a large number of free electrons similar to an n-type doped material, thus creating a p-n junction at the interface between the substrate 202 and the schottky contact 604 to form schottky MBD 606.

Ohmic contact 602 is typically deposited first, and etched away such that schottky contact 604 can be deposited in a subsequent step. Because the schottky MBD 606 formed using schottky contact 604 is shorted to the substrate 202 (e.g., the anode of the schottky MBD 606 is the substrate 202), the schottky MBD 606 is typically used to protect an assembly 600 other than the assembly 600 it is part of. Schottky MBD may also be formed on an epitaxial layer grown on the back of substrate 202, similar to that shown in FIG. 4 with layers 410 and 412.

Figure 7:
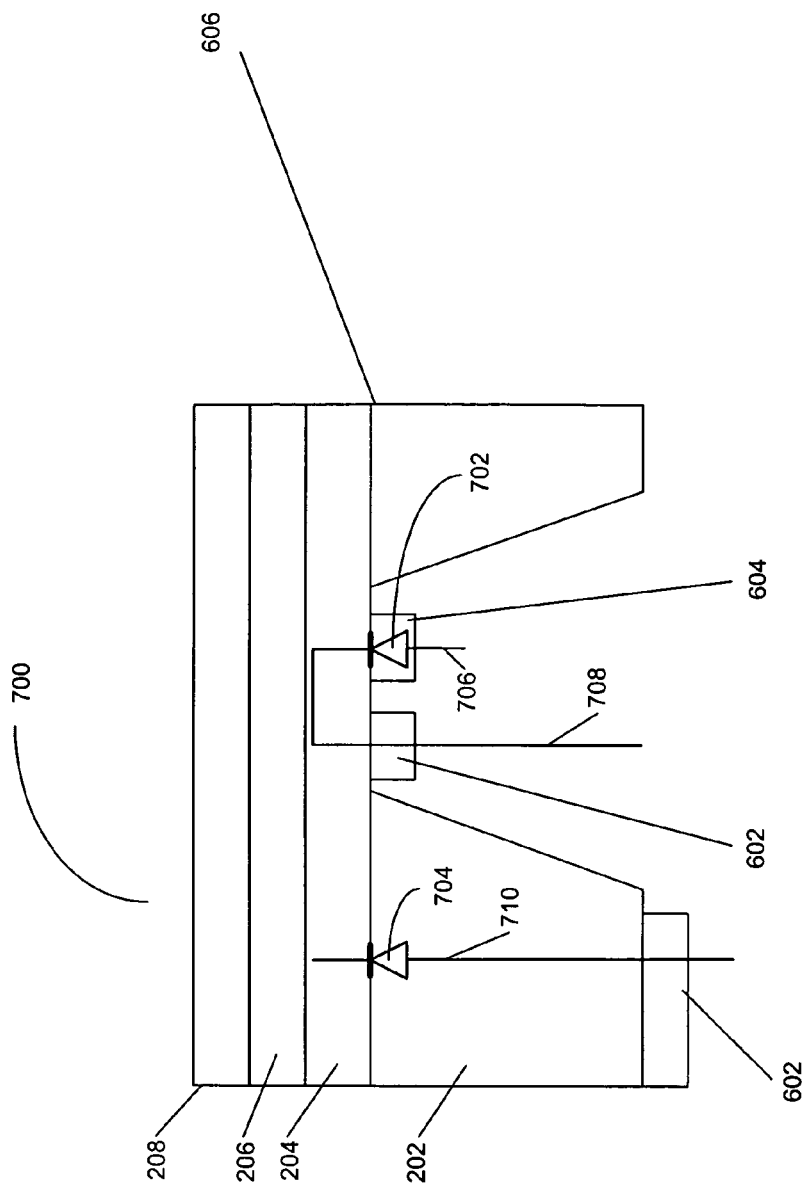
FIG. 7 illustrates an isolated schottky MBD in accordance with the present invention.

FIG. 7 illustrates an isolated schottky MBD in accordance with the present invention.

Assembly 700 illustrates a thinned substrate 202, where the substrate has been removed completely in an area such that ohmic contact 602 and schottky contact 604 can be formed on a layer of first cell 204. This assembly 700 now electrically isolates schottky MBD 702 (formed by schottky contact 604 as the anode and a layer of first cell 204 as the cathode) from solar cell 704 (formed by substrate 202 as the anode and a layer of first cell 204 as the cathode), which allows for anode 706 and cathode 708 of schottky MBD 702 to be coupled in any way desired, including coupling cathode 708 to anode 710 of solar cell 704. As such, assembly 700 can have schottky MBD 702 protect the solar cell 704 which schottky MBD 702 is physically formed on.

Process Chart

Figure 8:
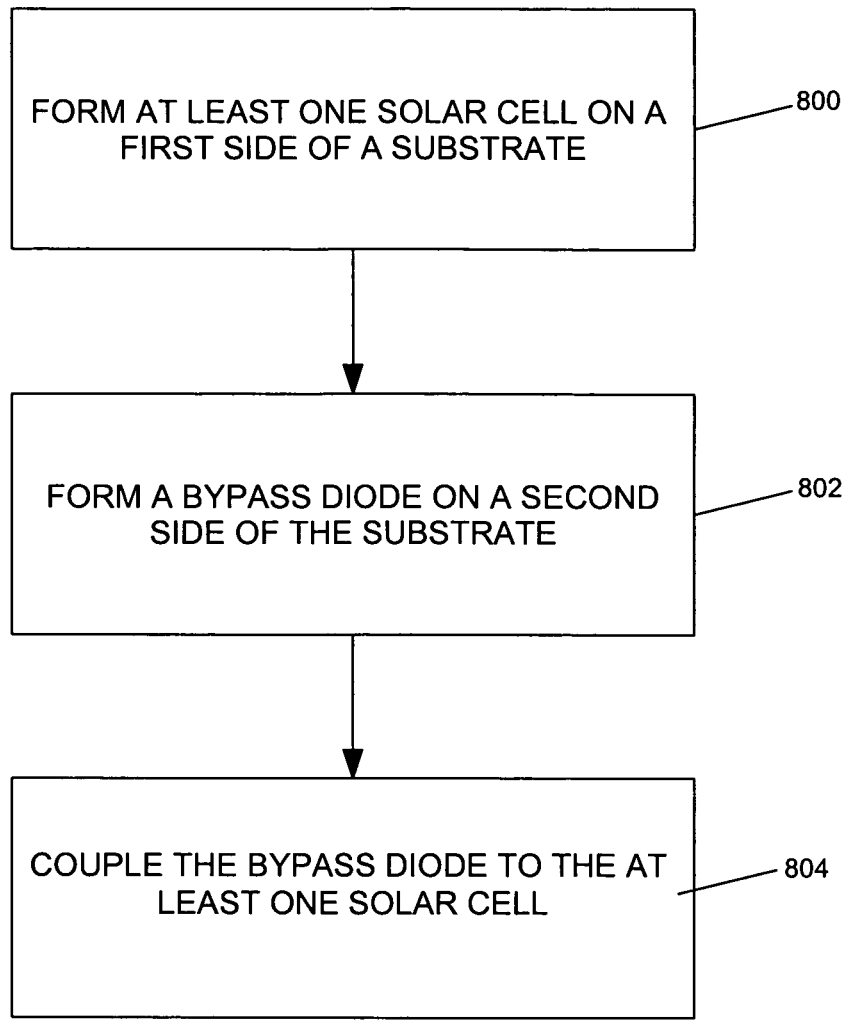
FIG. 8 is a flow chart showing the operations used to practice one embodiment of the present invention.

FIG. 8 is a flow chart showing the operations used to practice one embodiment of the present invention.

Box 800 illustrates forming at least one solar cell on a first side of a substrate.

Box 802 illustrates forming a bypass diode on a second side of the substrate.

Box 804 illustrates coupling the bypass diode to the at least one solar cell.

CONCLUSION

This concludes the description of the preferred embodiments of the present invention. In summary, the present invention describes an apparatus and method for making a monolithic bypass diode and solar cell assembly.

As described herein, the substrate is typically a germanium substrate, however, any semiconductor substrate, such as germanium, GaAs, InP, Si, GaSb, GaP, GaN, SiC, or other semiconductor materials can be used for the substrate material without departing from the scope of the present invention. Further, any polarity type can be used for the substrate and/or solar cell junctions, i.e., p-type and n-type materials can be changed as long as p-n junctions are formed in the proper manner. Although the examples are shown for multi-junction solar cells, the MBD's of the present invention can be used to protect other types of devices, such as single-junction solar cells, laser power converters, thermophotovoltaic cells, sensors, and other electronic and optoelectronic devices.

An apparatus in accordance with the present invention comprises a substrate, at least a first solar cell, coupled to a first side of the substrate, the first side of the substrate to be exposed to light such that the at least first solar cell generates a current when exposed to the light, and a bypass diode, formed on a second side of the substrate, the second side of the substrate being substantially opposite the first side of the substrate, such that the bypass diode is monolithically integrated with the at least first solar cell.

Such an apparatus optionally includes the bypass diode being formed in the substrate, using a schottky barrier, or being grown on the substrate, the solar cell being a multi-junction solar cell, the bypass diode is connected to a solar cell resident on a solar cell assembly other than the solar cell assembly where the bypass diode is formed, the substrate being etched away prior to forming the bypass diode, the bypass diode being electrically isolated from the substrate, and the bypass diode being connected in an anti-parallel fashion with the at least one solar cell.

A method in accordance with the present invention comprises forming at least one solar cell on a first side of a substrate, the first side of the substrate to be exposed to light such that the at least first solar cell generates a current when exposed to the light, forming a bypass diode on a second side of the substrate, the second side of the substrate being substantially opposite the first side of the substrate, and coupling the bypass diode to the at least one solar cell.

Such a method optionally further includes the bypass diode of a first assembly being coupled to a solar cell on a second assembly, the bypass diode being formed in the substrate, grown on the substrate, or being formed using a schottky barrier, the solar cell being a multi-junction solar cell, etching the substrate away prior to forming the bypass diode, and the bypass diode being electrically isolated from the substrate.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto and the equivalents thereof.

What is claimed is:

1. A solar cell assembly, comprising:
    a germanium (Ge) substrate;
    at least a first solar cell, coupled to a first side of the Ge substrate, the first side of the Ge substrate to be exposed to light such that the at least first solar cell generates a current when exposed to the light; and
    two Schottky barrier bypass diodes connected in series, the two series connected Schottky barrier bypass diodes being connected in anti-parallel with the at least one solar cell, and the two series connected Schottky barrier bypass diodes being monolithically integrated with the Ge substrate and formed in a single recess or on a surface of a second side of the Ge substrate, the second side of the Ge substrate being substantially opposite the first side of the Ge substrate, such that the two series connected Schottky barrier bypass diodes reduce the leakage current in the solar cell assembly.

2. The solar cell assembly of claim 1, wherein the two series connected Schottky barrier bypass diodes are formed in the Ge substrate.

3. The solar cell assembly of claim 1, wherein the at least first solar cell is a multi junction solar cell.

4. The solar cell assembly of claim 2, wherein the two series connected Schottky barrier bypass diodes are connected to a solar cell resident on a solar cell assembly other than the solar cell assembly where the two series connected Schottky barrier bypass diodes are formed.

5. The solar cell assembly of claim 1, wherein the two series connected Schottky barrier bypass diodes are grown on the second side of the Ge substrate.

6. The solar cell assembly of claim 1, wherein the Ge substrate is etched away prior to forming the two series connected Schottky barrier bypass diodes.

7. The solar cell assembly of claim 6, wherein the two series connected Schottky barrier bypass diodes are electrically isolated from the at least one solar cell.

8. A method for making a solar cell assembly, comprising:
    forming at least one solar cell on a first side of a germanium (Ge) substrate, the first side of the Ge substrate to be exposed to light such that the at least first solar cell generates a current when exposed to the light;
    forming two Schottky barrier bypass diodes connected in series, the two series connected Schottky barrier bypass diodes being connected in anti-parallel with the at least one solar cell, and the two series connected Schottky barrier bypass diodes being monolithically integrated with the Ge substrate and formed in a single recess or on a surface of a second side of the Ge substrate, the second side of the Ge substrate being substantially opposite the first side of the Ge substrate, such that the two series connected Schottky barrier bypass diodes reduce the leakage current in the solar cell assembly.

9. The method of claim 8, wherein the two series connected Schottky barrier bypass diodes are connected to a solar cell resident on a solar cell assembly other than the solar cell assembly where the two series connected Schottky bypass diodes are formed.

10. The method of claim 8, wherein the two series connected Schottky barrier bypass diodes are formed in the Ge substrate.

11. The method of claim 8, wherein the two series connected Schottky barrier bypass diodes are formed using a schottky barrier.

12. The method of claim 8, wherein the at least first solar cell is a multi junction solar cell.

13. The method of claim 8, wherein the two series connected Schottky barrier bypass diodes are grown on the second side of the Ge substrate.

14. The method of claim 8, further comprising etching the Ge substrate away prior to forming the two series connected Schottky barrier bypass diodes.

15. The method of claim 14, wherein the two series connected Schottky barrier bypass diodes are electrically isolated from the Ge substrate.

* * * * *